United States Patent
Barachevsky et al.

(10) Patent No.: US 7,244,548 B2
(45) Date of Patent: Jul. 17, 2007

(54) PHOTOPOLYMERIZING COMPOSITION AND PHOTOPOLYMERIZING RECORDING MEDIUM MANUFACTURED USING THE SAME AND USED TO MANUFACTURE 3D OPTICAL MEMORY HAVING ULTRA-HIGH INFORMATION STORAGE CAPACITY

(75) Inventors: Valery Aleksandrovich Barachevsky, Moscow (RU); Svetlana Ivanovna Peredereeva, Moscow (RU); Dmitry Valerevich Nesterenko, Moscow (RU); Aleksandr Vladimirovich Lyubimov, Moscow (RU); Viktor Kamilievich Salahutdinov, Moscow (RU); Mikhail Mikhailovich Krayushkin, Moscow (RU); Nataliya Timofeovna Sokolyuk, Moscow (RU); Andrei Leanovich Mikaelyan, Moscow (RU)

(73) Assignees: Samsung Electronics Co., Ltd., Suwon-si (KR); Photochemistry Center of Russian Academy of Sciences, Moscow (RU)

( * ) Notice: Subject to any disclaimer, the term of this patent is extended or adjusted under 35 U.S.C. 154(b) by 108 days.

(21) Appl. No.: 10/993,125

(22) Filed: Nov. 22, 2004

(65) Prior Publication Data

US 2006/0111461 A1    May 25, 2006

(30) Foreign Application Priority Data

Nov. 21, 2003    (RU) ............................... 2003133969

(51) Int. Cl.
*G03C 1/00* (2006.01)
*G03C 1/685* (2006.01)
*G03C 1/72* (2006.01)
*C08F 2/46* (2006.01)

(52) U.S. Cl. ............... 430/286.1; 430/281.1; 430/270.1; 430/270.11; 430/270.15; 430/1; 430/2; 522/36; 522/37; 522/49; 522/50; 522/53; 522/68; 522/69; 522/70; 522/113; 522/114; 522/120; 522/121; 522/150; 522/153; 522/170; 522/178

(58) Field of Classification Search .............. 430/1, 430/2, 270.1, 270.11, 270.15, 281.1, 286.1; 522/36, 37, 49, 50, 53, 68, 69, 70, 113, 114, 522/120, 121, 150, 153, 170, 178, 182
See application file for complete search history.

(56) References Cited

U.S. PATENT DOCUMENTS

| | | | |
|---|---|---|---|
| 3,989,530 A | * | 11/1976 | Robillard .................. 430/1 |
| 4,942,112 A | | 7/1990 | Monroe et al. |
| 4,950,567 A | * | 8/1990 | Keys et al. .................. 430/1 |
| 5,230,986 A | | 7/1993 | Neckers |
| 6,398,981 B1 | | 6/2002 | Galstian et al. |

* cited by examiner

*Primary Examiner*—Sanza L. McClendon
(74) *Attorney, Agent, or Firm*—Stein, McEwen & Bui, LLP (57) ABSTRACT

A photopolymerizing composition and a photopolymerizing recording medium manufactured using the composition, wherein the photopolymerizing composition contains: 1.0-99.0% by weight of at least one kind of polymerizable compound; 0.05-0.5% by weight of at least one kind of photosensitizer selected from among photochromic compounds that change color by incoherent UV light irradiation; 0.2-6.0% by weight of a coinitiator that is activated by visible light in the presence of a photoinduced form of the photochromic compound transformed by incoherent UV light to photopolymerize the polymerizable compound; 0-97.5% by weight of a polymer binding agent; 0-6.0% by weight of a plasticizer; and 0-3.0% by weight of a non-polymerizing solvent. The photopolymerizing recording medium has a high angular diffraction selectivity and thus can be effectively used to manufacture a 3D holographic optical memory with ultra high information storage capacity.

24 Claims, 1 Drawing Sheet

FIG. 1

PHOTOPOLYMERIZING COMPOSITION AND PHOTOPOLYMERIZING RECORDING MEDIUM MANUFACTURED USING THE SAME AND USED TO MANUFACTURE 3D OPTICAL MEMORY HAVING ULTRA-HIGH INFORMATION STORAGE CAPACITY

CROSS-REFERENCE TO RELATED APPLICATION

This application claims the priority of Russian Patent Application No. 2003-133969, filed on Nov. 21, 2003 in the Russian Intellectual Property Office, the disclosure of which is incorporated herein by reference.

BACKGROUND OF THE INVENTION

1. Field of the Invention

The present invention relates to a photopolymerizing composition and a photopolymerizing recording medium manufactured using the same, and more particularly, to a photopolymerizing composition and a photopolymerizing recording medium that is manufactured using the composition and can be used to manufacture a 3D, ultra-high information storage capacity optical memory.

2. Description of the Related Art

Holograms, which are created by recording an interference pattern of coherent laser light on, for example, a photosensitive material, are multifunctional, so they have various applications in the optical memory, 3D-image display, image processing fields, etc.

In particular, optical memories can be manufactured by forming a deep hologram using a refractive index variation induced due to a variation in the density of a substance composing a thick photopolymerizing recording medium. The hologram can be generated by photopolymerizing a photosensitive recording layer, which contains a photopolymerizable monomer, of the recording medium by exposing the layer to a laser light of proper intensity. The degree of polymerization of the photosensitive layer depends on the intensity of incident active light. The generated image having a set of lines of different intensity is recorded based on a polymer density variation. The generated polymer, having a refraction factor that differs from the refraction factor of an initial monomer, will be characterized by a refraction factor depending on radiation intensity on different areas of the photosensitive layer. These differences are used for recovering an image using light wave phase recovery. A deep hologram can be recorded as a result of photobleaching of a photosensitive component in the recording medium, i.e., penetration of laser light into the recording medium, in a hologram recording process. Deep holograms recorded in the thick layer determine a high angular selectivity of holograms and image recovery. A higher angular selectivity leads to a larger high information storage capacity.

Photopolymerizing media using a monomer-oligomer composition and a photoinitiating system are widely known. A photopolymerizing medium further contains a photobleaching dye and a coinitiator (Carretero L., Blaya S., Mallavia R., et al., Appl. Opt. 1998. Vol. 37, p. 4496). Post-exposure and thermal treatments are required to obtain a phase hologram, thereby making it difficult to use an archive optical memory device.

U.S. Pat. No. 5,230,986 discloses a photocurable composition composed of a free radical-polymerizable compound, an electron-donating coinitiator, and a photochromic benzospiropyran compound of formula (1) below. This benzospiropyran compound undergoes ring opening when exposed to a first actinic radiation or heat, forming a merocyanine compound of formula (II) below. This merocyanine compound generates free radicals when exposed to a second actinic radiation. The free radicals generated from the benzospiropyran compound induce photopolymerization of the polymerizable compound, thereby curing the composition.

In formulae (I) and (II), each of $X_1$ and $X_3$ is independently selected from the group consisting of hydrogen, iodo, nitro, cyano, bromo, chloro, fluoro, and amino, at least one of the two groups $X_1$ and $X_3$ is not hydrogen, and $X_2$ is selected from the group consisting of hydrogen, alkoxy, carboxy, ester, and amino.

Referring to the above reaction scheme, the benzospirane compound undergoes a reversible intramolecular transformation by UV light irradiation or heating and forms a merocyanine isomer. When the colored merocyanine form is irradiated by visible light in the presence of a reducing coinitiator and an olefinically unsaturated compound, polymerization initiating radicals are generated. The colored merocyanine form can act as a visible light photoinitiator. Photopolymerization can be achieved by visible light absorbed by the merocyanine isomer. A photopolymerizing recording medium using such a photopolymerizing polymer is spontaneously desensitized when UV radiation is interrupted or when cooling the photosensitive layer.

Disadvantageously, such a photopolymerizing recording medium requires an additional light source or heat energy when a hologram is recorded by visible laser light, thereby complicating the structure of a 3D imaging apparatus. Constant UV irradiation or heating maintains the concentration of the merocyanine isomer constant, thereby preventing deep light penetration into the recording medium and disabling recording of a deep hologram. As a result, both angular selectivity and information storage capacity decrease. In addition, a thermal distortion of interference patterns occurs as the recording medium is heated, thereby reducing resolution capability. Since the recording medium is in liquid state, a continuous post-exposure process is required after the recording of the hologram, thereby increasing power consumption and the optical memory formation time.

These disadvantages are caused due to an insufficient lifespan of the photoinduced structure of the photochromic compound, which is used as a photosensitizer in the photopolymerizing composition used to form a recording layer of the photopolymerizing recording medium. Moreover, the photopolymerizing composition does not contain a polymer binder or components that facilitate media photopolymerization during recording of a hologram.

SUMMARY OF THE INVENTION

According to an aspect of the present invention, there is provided a photopolymerizing composition that is capable of increasing angular sensitivity of photopolymerizing recording medium to holograms recording and image recovery by recording deep holograms in a thick photosensitive layer.

According to an aspect of the present invention, there is provided a photopolymerizing recording medium manufactured using the photopolymerizing composition. The photopolymerizing recording medium can be used to manufacture a 3D holographic optical memory with ultra high information storage capacity and to manufacture a simplified optical hologram recording device.

In an aspect of the present invention, there is provided a photopolymerizing composition having: 1.0-99.0% by weight of at least one kind of polymerizable compound; 0.05-0.5% by weight of at least one kind of photosensitizer selected from among photochromic compounds that change color by incoherent UV light irradiation; 0.2-6.0% by weight of a coinitiator that is activated by visible light in the presence of a photoinduced form of the photochromic compound transformed by incoherent UV light to photopolymerizes the polymerizable compound; 0-97.5% by weight of a polymer binding agent; 0-6.0% by weight of a plasticizer; and 0-3.0% by weight of a non-polymerizing solvent.

In another aspect of the present invention, there is provided a photopolymerizing recording medium having; a transparent substrate; and a photosensitive layer deposited on the transparent substrate as a recording layer, wherein the photosensitive layer includes: 1.0-99.0% by weight of at least one kind of polymerizable compound; 0.05-0.5% by weight of at least one kind of photosensitizer selected from among photochromic compounds that change color by incoherent UV light irradiation; 0.2-6.0% by weight of a coinitiator that is activated by visible light in the presence of a photoinduced form of the photochromic compound transformed by incoherent UV light to photopolymerizes the photopolymerizing composition; 0-97.5% by weight of a polymer binding agent; 0-6.0% by weight of a plasticizer; and 0-3.0% by weight of a non-polymerizing solvent.

According to an aspect of the present invention, the photosensitizer may be a photochromic compound having a long lifespan photoinduced structure, such as benzothiazolene spiropyrans, phenoxynaphthacenequinones, and a mixture of these compounds, or a thermally irreversible photochromic compound such as dihetarylethenes, fylgimides, and a mixture of these compounds.

In another aspect of the present invention, there is provided a method of recording a hologram on the above-described photopolymerizing recording medium, the method including: radiating incoherent UV light onto the photosensitive layer of the recording medium to transform a photochromic compound into a colored form; and radiating an interference pattern of a reference beam and an object beam, which are split from coherent visible laser light onto the photosensitive layer to induce photopolymerization of the polymerizable compound using free radicals generated in the presence of a photoinduced form of the colored photochromic compound and the coinitiator, thereby recording the interference pattern in the photosensitive layer as a refractive index difference.

According to another aspect of the present invention, there is provided a method of reproducing a hologram recorded on the above-described photopolymerizing recording medium, the method including irradiating only a reference beam used to record the hologram onto the recording medium.

In the photopolymerizing composition and the photopolymerizing recording method according to an aspect of the present invention, a combination of the specific photochromic photosensitizer and the coinitiator is used as a photoinitiator system that initiates photopolymerization of the polymerizable compound. The photosensitizer transforms into a colored photoinduced structure by incoherent UV light. The coinitiator is activated in the presence of the colored photoinduced structure by visible light to initiate photopolymerization of the polymerizable compound.

The photopolymerizing recording medium according to another aspect of the present invention, which includes a photosensitive recording layer formed using the photopolymerizing composition, can be effectively used as a hologram recording medium. In addition, the photopolymerizing recording medium according to an aspect of the present invention requires no post-exposure and thermal treatment is required after recording a hologram.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the present invention will become more apparent and more readily appreciated from the following description of the embodiments, taken in conjunction with the accompanying drawings of which.

DETAILED DESCRIPTION OF THE EMBODIMENTS

Embodiments of a photopolymerizing composition and a photopolymerizing recording medium manufactured using the composition according to aspects of the present invention will be described in detail.

As described above, a photopolymerizing composition according to an embodiment of the present invention includes: 1.0-99.0% by weight of at least one kind of polymerizable compound; 0.05-0.5% by weight of at least one kind of photosensitizer selected from among photochromic compounds that change color by incoherent UV light irradiation; 0.2-6.0% by weight of a coinitiator that is activated by visible light in the presence of a photoinduced form of the photochromic compound transformed by incoherent UV light to photopolymerizes the photopolymerizable compound; 0-97.5% by weight of a polymer binding agent; 0-6.0% by weight of a plasticizer; and 0-3.0% by weight of a non-polymerizing solvent.

As described above, a photopolymerizing recording medium according to an embodiment of the present invention includes: a transparent substrate; and a photosensitive layer deposited on the transparent substrate as a recording layer, herein the photosensitive layer contains: 1.0-99.0% by weight of at least one kind of polymerizable compound; 0.05-0.5% by weight of at least one kind of photosensitizer selected from among photochromic compounds that change color by incoherent UV light irradiation; 0.2-6.0% by weight of a coinitiator that is activated by visible light in the presence of a photoinduced form of the photochromic compound transformed by incoherent UV light to photopolymerize the polymerizable compound; 0-97.5% by weight of a polymer binding agent; 0-6.0% by weight of a plasticizer; and 0-3.0% by weight of a non-polymerizing solvent.

Any kind of photosensitizer that can absorb UV light can be used. In the composition according to the present invention, a photochromic compound having a longer lifespan photoinduced structure that is selected from the group consisting of benzothiazolene spiropyrans (II), phenoxynaphthacenequinones (III), and a mixture of these compounds, or a thermally irreversible photochromic compound selected from the group consisting of dihetraylethenes (IV), fylgimides (V), and a mixture of these compounds is used.

The benzothiazolene spiropyran (II) undergoes photochromic transformation according to reaction scheme (1) below.

Reaction scheme (1)

(II)

In reaction scheme (1), R is a hydrogen atom, alkyl, aryl, aralkyl, or alkylaryl. The "alkyl" group can be a C1-C30 alkyl group, preferably a C1-20 alkyl group. The alkyl group can be a straight, branched, or cyclic alkyl group. The "aryl" group refers to a C6-C10 aryl group such as phenyl and naphthyl. The "aralkyl" group refers to a C7-C20 aralkyl group such as benzyl. The "akylaryl" group refers to a C7-C20 alkylaryl group such as methylphenyl, methylnathphyl, etc.

In Table 1, the spectral-kinetic characteristics after photochromic transformation of benzothiazolene spiropyrans (BTSP) in the photopolymerizing composition according to aspects of the present invention are shown.

TABLE 1

| Compound | R | Spectral characteristics of the photoinduced structure $\lambda_{max}$, nm | Reaction rate constant of thermal bleaching of the photoinduced structure $k \times 10^3$, $c^{-1}$ |
|---|---|---|---|
| BTSP 1 | $C_{16}H_{33}$ | 580 | 2.9 |
| BTSP 2 | $C_6H_5$ | 610 | 6.1 |
| BTSP 3 | β-naphthol | 605 | 9.0 |
| BTSP 4 | $C_3H_7$ | 572 | 5.2 |

The phenoxynaphthacenequinone (III) undergoes photochromic transformation according to reaction scheme (2) below.

Reaction scheme (2)

(III)

In reaction scheme (2), each of $R_1$, $R_2$, and $R_3$ is independently selected from the group consisting of a hydrogen atom, aryl, aralkyl, and alkylaryl. The "alkyl" group refers to a C1-C30 alkyl group, preferably, a C1-C20 alkyl group. The alkyl group can be a straight, branched, or cyclic alkyl group. The "aryl" group refers to a C6-C10 aryl group such as phenyl and naphthyl. The "aralky" group refers to a C7-C20 aralkyl group such as benzyl. The "alkylaryl" group refers to a C7-C20 alkylaryl group such as methylphenyl, methylnaphthyl, etc.

In Table 2, the structures and spectral-kinetic characteristics of photochromic phenoxynaphthacenequinone (PNC) derivatives in the photopolymerizing composition according to aspects of the present invention are shown.

Reaction scheme (3)

(IV)

In reaction scheme (3), each of $R_1$ and $R_4$ is a five- or six-membered, fused complex ring having at least one hetero atom selected from among N, S, and O, or a fused

TABLE 2

| Compound | Structure | Spectral characteristic of the photoinduced structure ($\lambda_{max}$, nm) | Reaction rate constant of thermal bleaching of the photoinduced structure ($k \times 10^8$, $c^{-1}$) |
| --- | --- | --- | --- |
| PNC 1 | $OC_6H_5$ ... structure | 453<br>480 | 1.0 |
| PNC 2 | $H_{13}C_9C_6H_4O$ ... structure | 447<br>478 | 1.1 |

The dihetarylethene (IV), among the thermally irreversible photochromic compounds referred to above, undergoes photochromic transformation according to aspects of reaction scheme (3).

$C_6$-$C_{10}$ aryl group; each of $R_2$ and $R_3$ is independently a hydrogen atom or a substituted or unsubstituted $C_1$-$C_{10}$ alkyl group; X is S, O, NH, or NR where R is a $C_1$-$C_{10}$ alkyl group; and a Y portion delimited by waves lines is a cyclopentene ring or a cyclopentene ring having at least one hetero atom selected from among N, S, and O, as in compounds DHE 1 and DHE 2 in Table 3 below. Examples of the fused complex ring for $R_1$ and $R_4$ includes a thiopene ring, a piperidine ring, a pyrrole ring, etc., which appear in compounds DHE 1 and DHE 2 in Table 3.

In Table 3, the structure and spectral characteristics of photochromic dihetarylethene (DHE) derivatives in the photopolymerizing composition according to aspects of the present invention are shown.

TABLE 3

| Compound | Structure | Spectral characteristics of the photoinduced structure, $\lambda_{max}$, nm |
|---|---|---|
| DHE 1 |  $R_1 = R_2 = CH_2(OCH_3)$ | 510 |
| DHE 2 |  $R_1 = R_2 = CO(OCH_3)$ | 520 |
| DHE 3 |  $R = CH_2\text{---}(CO)Ph \quad R_1 = R_2 = CO(OCH_3)$ | 420 560 600 |

The fylgimide (V), among the thermally irreversible photochromic compounds referred to above, undergo photochromic transformation according to an aspect of reaction scheme (4).

Reaction scheme (4)

X = O, S, NH, N—R

In reaction scheme (4), Ar is a five- or six-membered complex ring having at least one hetero atom selected from among N, S, and O, or a C6-C10 aryl group; each of R1, R2, and R3 is independently selected from among a hydrogen atom, a substituted or unsubstituted C1-C10 alkyl group; and X is selected from among S, O, NH, and NR where R is a C1-C10 alkyl group or a —NHCO$_2$R$_4$ where R$_4$ is a substituted or unsubstituted C1-C10 alkyl group. In a closed photoinduced structure in a right portion of reaction scheme (4), the Ar delimited by a waves line represents a remaining portion of the above-defined Ar.

In Table 4, the structure and spectral characteristics of a photochromic fylgimide (FGM) derivative in the photopolymerizing composition according to aspects of the present invention are shown.

TABLE 4

| Compound | Structure | Spectral characteristics of the photoinduced structure ($\lambda_{max}$, nm) |
| --- | --- | --- |
| FGM 1 | NHCO$_2$Bu | 520 |

The above-described photosensitizers can be used individually or in combinations of at least two. In the photopolymerizing composition according to an aspect of the present invention, a concentration of the photosensitizer may be in a range of about 0.05-5.0% by weight.

The coinitiator, which composes a photoinitiator system in the composition according to an aspect of the present invention together with the photochromic sensitizer, is activated by visible light, together with the photochromic compound having the photoinduced structure in the presence of a polymerizable monomer, photopolymerizing the polymerizable monomer. The visible light that can be used in the present invention can be laser light having a wavelength of 400-650 nm, for example, He—Ne laser (633 nm), Ar laser (515 nm, 488 nm), YAG laser (532 nm), He—Cd (442 nm), etc.

Coinitiators that are widely known in the field can be effectively used as the coinitiator. In particular, the coinitiator can be selected from among widely known electron-donating coinitiators, such as N-phenylglycine, N,N-dialkylanilines, tertiary amine compounds, organoborate salts, etc. Examples of N,N-dialkyllaniline compounds include 4-cyano-N,N-dimethylaniline, 4-bromo-N,N-dimethylaniline, 4-acetyl-N,N-dimethylaniline, 4-methyl-N,N-dimethylaniline, 4-amino-N,N-dimethylaniline, 4-ethoxy-N,N-dimethylaniline, 3-hydroxy-N,N-dimethylaniline, N,N,N',N'-tetramethyl-1,4-dianiline, 2,6-diethyl-N,N-dimethylaniline, p-t-butyl-N,N-dimethylaniline, etc. Examples of tertiary amine compounds include triethylamine, dimethylethanolamine (DMEA), triethanolamine (TEA), triisopropanolamine, etc. In addition, 2,2-dimethoxy-2-phenylacetophenone dimethylbenzylketal (DMBP) (Irgacure 651) can be effectively used. These coinitiators can be used individually or in combinations of at least two. In the photopolymerizing composition according to the present invention, a concentration of the coinitiator may be in a range of about 0.2-6.0% by weight.

The polymerizable compound used in the composition according to an aspect of the present invention has at least one unsaturated double bond that can be polymerized according to the reaction mechanism of radicals. This kind of polymerizable compound can be a monomer having at least one ethylenically unsaturated bond, such as vinyl and allyl, or a polymer having a terminal or pendent ethylenically unsaturated bond, which are widely known in the field. Examples of the polymerizable compound include acryl and methacryl esters of polyhydric alcohols, such as trimethylolpropane, pentaerythritol, etc.; acrylate- or methacrylate-terminated epoxy resin; acrylate- or methacrylate-terminated polyester, etc.

Additional examples of the polymerizable compound include butyl methacrylate, cyclohexyl methacrylate, ethyleneglycol diacrylate, ethyleneglycol dimethacrylate, trimethylolpropane triacrylate (TMPTA); pentaerythritol trimethacrylate, pentaerythritol tetraacrylate, pentaerythritol tetramethacrylate, dipentaerythritol trimethacrylate, dipentaerythritol hydroxypentacrylate (DPHPA), hexandiol-1,6-dimethacrylate, diethyleneglycol dimethacrylate, α,ω-bis (methacryloyloxyethyleneoxycarbonyloxy) ethyleneoxyethylene (OKM-2), bisphenol-A dimethacrylate, bisphenol-A ethoxylate diacrylate, bisphenol-A ethoxylate dimethacrylate, bisphenol-A bis(glycidyidimethacrylate) (bisGMA), bisphenol-A glycerolate diacrylate, bisphenol-A glycerolate dimethacrylate, bisphenol-A propoxylate glycerolate, glycerol diacrylate, glycerol dimethacrylate, glycerol triacrylate, glycerol trimethacrylate (TMG), N-vinyl pyrrolidone (VP), 9-vinylcarbazole, glycidyl methacrylate, and a mixture of the forgoing compounds.

The above-listed polymerizable compounds can be used individually or in combination of at least two thereof. In the photopolymerizing composition according to an aspect of the present invention, a concentration of the polymerizable compound may be in a range of 1.0-99.0% by weight.

The polymer binding agent used in the photopolymerizing composition according to an aspect of the present invention is used to suppress flowing of the composition and is not involved in photopolymerization reaction. In other words, the polymer binding agent suppresses flowing of the photopolymerizing composition according to an aspect of the present invention, which is applied between a transparent substrate and a protective layer, while a hologram is recorded, thereby enabling satisfactory hologram recording.

Examples of the polymer binding agent that can be used in the present invention include vinyl polymers such as polyvinylacetate, polyvinylchloride, etc., acrylic polymers such as polymethyacrylate, polyethylacrylate, etc.; methacrylic polymers such as polymethylmethacrylate (PMMA), polyethylmethacrylate, etc. Among the listed polymer binding agents, PMMA is preferred to record a hologram in a recording medium which is highly thermally resistant, highly transparent, highly sensitive, and of high diffraction efficiency.

The above-listed polymer binding agents can be used individually or in combinations of at least two. In the photopolymerizing composition according to an aspect of the present invention, a concentration of the polymer binding agent may be in a range of about 0-97.5% by weight.

The plasticizer used in the composition according to an aspect of the present invention adjusts the viscosity and miscibility of the composition and facilitates separation of the polymer binding agent and the polymerizable compound when a hologram is recorded. The plasticizer is a compound that does not react with the polymer binding agent and the polymerizable compound. Examples of the plasticizer that can be used in the composition according to an aspect of the present invention include phthalates such as dimethyl phthalate, diethyl phthalate, dibutyl phthalate (DBP), diethylhexyl phthalate, dioctyl phthalate, etc.; esters of an aliphatic dibasic acid such as dimethyl adiphate, dibutyl adiphate, dimethylsebasate, diethylserbasate, dibutylserbasate, diethylsuccinate, etc.; phosphates such as trimethyl phosphate, triethyl phosphate, triphenyl phosphate, triglycidyl phosphate, etc.; acetates such as glyceryl triacetate, 2-ethylhexyl acetate, etc; phosphites such as triphenyl phosphite, dibutylhydrodiene phosphite, etc.; alkyleneglycolalkylethers such as ethyleneglycoldimethylether, ethyleneglycoldiethylether, diethyleneglycoldimethylether, etc; a low-molecular weight polyethyleneglycol; silicon oil; etc.

The above-listed plasticizers can be used individually or in combinations of at least two. In the photopolymerizing composition according to an aspect of the present invention, a concentration of the plasticizer may be in a range of 0-6.0% by weight.

The photopolymerizing composition according to an aspect of the present invention may further include additives such as a thickening agent, a thermal polymerization inhibitor, a chain transfer agent, which are widely used in the field, a solvent, etc., if required.

A high refractive index solvent can be used to adjust the viscosity of the composition and the miscibility of each of the composition and to improve layer formation. Examples of the solvent that can be used in the composition according to an aspect of the present invention include acetone, benzene, toluene, xylene, methylethylketone, tetrahydrofuran, methylene dichloride, chloroform, halogenated benzene, halogenated toluene, a mixture of these solvents, etc. Among these solvents, bromobenzene (BB), chlorobenzene, bromotoluene, chlorotoluene, etc., which contain a halogen atom such as chlorine, bromine, etc., which induces high refractive index, are preferred.

The above-listed solvents can be used individually or in combinations of at least two. In the photopolymerizing composition according to the present invention, a concentration of the solvent may be in a range of about 0-3.0% by weight.

A method of preparing the photopolymerizing composition according to an aspect of the present invention will be described.

At least one photosensitizer selected from the above-described photochromic compounds, a coinitiator, a polymerizable compound, a polymer binding agent, and an additive, which is described as a component that can be added if required, are put together in a container such as a beaker and stirred. To facilitate dissolution of the solid components, the mixture can be heated to a temperature range which do not induce denaturation of the composition.

A method of manufacturing a photopolymerizing recording medium using the photopolymerizing composition according to an aspect of the present invention will be described.

A photopolymerizing recording medium having a duplex structure, including a transparent substrate and a photosensitive layer, can be manufactured by coating the photopolymerizing composition according to an aspect of the present invention on the transparent substrate. Various coating techniques such as Gravia coating, roll coating, bar coating, spin coating, etc., can be used. A photopolymerizing recording medium having a triplex structure can be manufactured, if required, by depositing a film type, sheet type, or plate type protective layer on the photosensitive layer. It is preferable, but not necessary, to use a solvent when preparing the composition according to an aspect of the present invention. In this case, after a solution or suspension obtained by dissolving or suspending in the solvent at least one photosensitizer selected from among the above-described photochromic compounds, a coinitiator, a polymerizerable compound, a polymer binding agent, a plasticizer, and an additive, which can be added if required, is applied to the transparent substrate, the solvent is volatilized, thereby resulting in a photosensitive recording layer. When laminating a protective layer on the photosensitive recording layer, it is preferable, but not necessary, to remove the solvent prior to the deposition of the protective layer. The photosensitive layer may have a thickness of 1-200 µm after the solvent has been removed.

The transparent substrate may be an optically transparent glass plate or plastic plate or film, such as a PET plate or film, a polycarbonate plate or film, a polymethylmethacrylate plate or film, etc. The transparent substrate may have a thickness of 0.01-10 mm. It is usually of planar form. However, a winding transparent substrate or a transparent substrate with an irregular surface structure can be used. Like the transparent substrate, the protective layer can be formed of an optically transparent material. The protective layer may have a thickness of 0.01-10 mm.

A method of recording a hologram on the photopolymerizing recording medium according to an aspect of the present invention will be described. Initially, incoherent UV light is irradiated onto the photosensitive layer of the photopolymerizing recording medium according to an aspect of the present invention to transform the photochromic structure into a colored form. An interference pattern of coherent visible laser light is radiated onto the photosensitive layer. For example, the interference pattern can be obtained by splitting coherent visible laser light into a reference beam and an object beam using such as a beam splitter and then combining the reference beam and the object beam using such as a mirror. Alternatively, the interference pattern of light can be obtained by reflecting one laser beam using a mirror. As a result, free radicals are generated in the presence of the colored photochromic compound and the coinitiator and lead to photopolymerization of the polymerizable compound, so that the interference pattern can be recorded in the photosensitive layer as a refractive index difference. The difference is caused by a difference of the degree of polymerization that varies depending on the intensities of light in the interference pattern.

The hologram recorded on the recording medium according to an aspect of the present invention can be reproduced by radiating only the reference beam onto the recording medium. The hologram can be reproduced as a result of diffraction of the reference beam by the interference pattern. The method of reproducing a hologram is widely known in the field, and thus a detailed description thereof is not provided here.

When using the photopolymerizing composition according to an aspect of the present invention described above, no UV light source or heating element is required in addition to the laser light having a visible range wavelength. In other words, a short-time radiation of incoherent UV light onto the photopolymerizing recording medium before recording a hologram is enough. Due to a short-time coherent visible light absorption effect of the photoinduced structure of the photochromic compound, the medium is desensitized after the recording of the hologram has been complete. As a result, the cost of a recording apparatus is reduced, and the resolution capability of the recording medium is improved.

When the photopolymerizing composition according to an aspect of the present invention includes 2-dimethoxy-2-phenylacetophenonedimethylbenzylketal (Irgacure 651) as the coinitiator, photocuring may occur in the photosensitive layer.

The present invention will be described in greater detail with reference to the following examples. The following examples are for illustrative purposes and are not intended to limit the scope of the invention.

EXAMPLE 1

A photopolymerizing recording medium was manufactured as follows. Initially, a solution of photochromic phenoxynaphthacenequinone in N-vinyl pyrrolidone was prepared. Polymerizable compounds OKM-2 and TATMP and coinitiator DMEA were added into the solution and thoroughly mixed. The mixed solution was degassed for 20 minutes in a vacuum to remove air bubbles therefrom. The degassed solution was cast on a polyethyleneterephthalate (PET) film (product name: Lavsan film) with a 200 μm-thick spacer to form a photosensitive recording layer. An additional PET film (Lavsan film) was coated on the photosensitive layer to obtain a triplex-structure recording medium.

The composition of the photopolymerizing composition (sample 1) used to form the photosensitive layer of the recording medium is shown in Table 5.

A photoinduced refractive index change in the photosensitive layer, which determines the possibility of recording a phase hologram on the photosensitive layer, was measured using a refractometer (IRF-22, Russia). Several droplets of the sample were dropped onto the surface of a test prism of the refractormeter using a glass rod to measure the refractive index of the solution. Next, the photosensitive layer was placed between prisms and irradiated for 1 minute by UV light emitted from a lamp (DRS-250) through a color filter UFS-6 (λ=360 nm) to transform the chromatic compound into a colored form, and then the reflective index of the colored solution (photosensitive layer) was measured. Next, the colored solution was irradiated for 5 minutes by visible light (λ>400 nm) 400-nm visible light emitted from an Ol-18 lighter, and then the refractive index thereof was measured. The photopolymerizing efficiency of the photosensitive layer when exposed to visible light was measured using a difference in refractive index ($\Delta n = n^{vis} - n^{UV}$) after UV and visible light radiations on the photosensitive layer.

The photoinduced refractive index change ($\Delta n$) of sample 1 was 0.0020, indicating the possibility of recording a phase hologram on the recording medium manufactured using the photopolymerizing composition (sample 1) according to an aspect of the present invention.

EXAMPLE 2

A photopolymerizing composition (sample 2) (refer to Table 5 for the composition of this sample) was prepared in the same manner as in Example 1.

The photoinduced reflectivity change of sample 2 measured using the same method as described in Example 1 is shown in Table 5. The data indicates the possibility of recording a phase hologram using sample 2.

EXAMPLE 3

A photopolymerizing composition (sample 3) (refer to Table 5 for the composition of this sample) was prepared in the same manner as in Example 1, except that bromobenzene (BB) was used as a solvent instead of polymerizable compound VP.

The photoinduced reflectivity change of sample 3 measured using the same method as described in Example 1 is shown in Table 5. The data indicates the possibility of recording a phase hologram using sample 3.

TABLE 5

| Sample No. | Photochromic compound (wt %) | Coinitiator, (wt %) | | Polymerizable compound (wt %) | | | Non-polymerizing solvent (wt %) | Photoinduced refractive index change |
| --- | --- | --- | --- | --- | --- | --- | --- | --- |
| | | DMEA | TEA | OKM-2 | TMPTA | VP | BB | ($\Delta n = n^{vis} - n^{UV}$) |
| 1 | PNC 1 (0.25) | 2.33 | — | 89.10 | 4.90 | 3.42 | — | 0.0020 |
| 2 | PNC 1 (0.25) | — | 2.37 | 89.10 | 4.95 | 3.33 | — | 0.0045 |

TABLE 5-continued

| Sample No. | Photochromic compound (wt %) | Coinitiator, (wt %) | | Polymerizable compound (wt %) | | | Non-polymerizing solvent (wt %) | Photoinduced refractive index change |
|---|---|---|---|---|---|---|---|---|
| | | DMEA | TEA | OKM-2 | TMPTA | VP | BB | ($\Delta n = n^{vis} - n^{UV}$) |
| 3 | PNC 1 (0.25) | 2.28 | — | 89.77 | 4.99 | — | 2.71 | 0.0060 |

EXAMPLES 4-6

Photosensitive layers were manufactured using photopolymerizing compositions (refer to Table 6 for the composition) using the same method as described in Example 1. The photosensitive layers commonly contained UV photoinitiator DMBP as a coinitiator. DMBP induces photocuring of the layer due to a incoherent UV light effect. DMBP was added into the solution at a first stage of preparing each of the samples. The compositions of samples 4-6 are shown in Table 6.

Photoinduced refractive index changes measured using the same method as described in Example 1 are also shown in Table 3. The data indicates that photocuring can be induced in the photosensitive layer by the UV light that is used to generate the visible light-sensitive photoinduced form of the photosensitizer, and a phase hologram can be recorded using laser light in a visible wavelength range. The degree of photocuring was also measured using a refractive index difference ($\Delta n = n^{UV} - n^{init}$) before and after UV radiation on the sample.

EXAMPLES 7-20

Photosensitive layers containing PNC2 as a photochromic compound were manufactured using the same method as described in Example 1. The photosensitive layers commonly contained UV photoinitiator DMBP as a coinitiator. This photoinitiator induces photoconducting of the layer due to an incoherent UV light effect. The incoherent UV light was used to obtain a photoinduced form of the photochromic compound. DMBP was added into a solution of VP at a first stage of preparing each of the samples. The compositions of samples 7-10 are shown in Table 7.

Photoinduced refractive index changes measured using the same method as described in Example 1 are also shown in Table 7. The data indicates that photocuring can be induced in the photosensitive layer by the UV light that is used to generate the visible light-sensitive photoinduced form of the photosensitizer, and a phase hologram can be recorded using laser light in a visible wavelength range.

TABLE 6

| Sample No. | Photochromic compound (wt %) | Coinitiator (wt %) | | Polymerizable compound (wt %) | | | | | Photoinduced reflectivity change ($\Delta n$) | |
|---|---|---|---|---|---|---|---|---|---|---|
| | | DMEA | DMBP | OKM-2 | TMPTA | bis GMA | TGM | VP | $\Delta n = n^{UV} - n^{init}$ | $\Delta n = n^{vis} - n^{UV}$ |
| 4 | PNC 1 (0.24) | 2.18 | 0.41 | 88.90 | 4.94 | — | — | 3.33 | 0.0107 | 0.0094 |
| 5 | PNC 1 (0.41) | 2.25 | 0.52 | 69.82 | 23.28 | — | — | 3.72 | 0.0125 | 0.0025 |
| 6 | PNC 1 (0.29) | 2.35 | 0.40 | — | — | 46.59 | 46.59 | 3.77 | 0.0148 | 0.0070 |

TABLE 7

| Sample No. | Photochromic compound (wt %) | Coinitiator (wt %) | | | Polymerizable compound (wt %) | | | | Photoinduced refractive index change ($\Delta n$) | |
|---|---|---|---|---|---|---|---|---|---|---|
| | | DMEA | TEA | DMBP | OKM-2 | TMPTA | bis GMA | VP | $\Delta n = n^{UV} - n^{init}$ | $\Delta n = n^{vis} - n^{UV}$ |
| 7 | PNC 2 (0.24) | 2.26 | — | 0.43 | 88.43 | 4.91 | — | 3.73 | 0.0015 | 0.0040 |
| 8 | PNC 2 (0.23) | 2.21 | — | 0.44 | 46.67 | 46.67 | — | 3.78 | 0.0015 | 0.0045 |
| 9 | PNC 2 (0.22) | 2.26 | — | 0.44 | 93.35 | — | — | 3.73 | 0.0027 | 0.0060 |
| 10 | PNC 2 (0.25) | 2.16 | — | 0.52 | — | 93.24 | — | 3.83 | 0.0143 | 0.0012 |

TABLE 7-continued

| Sample No. | Photochromic compound (wt %) | Coinitiator (wt %) | | | Polymerizable compound (wt %) | | | | Photoinduced refractive index change ($\Delta n$) | |
|---|---|---|---|---|---|---|---|---|---|---|
| | | DMEA | TEA | DMBP | OKM-2 | TMPTA | bis GMA | VP | $\Delta n = n^{UV} - n^{init}$ | $\Delta n = n^{vis} - n^{UV}$ |
| 11 | PNC 2 (0.25) | 2.22 | — | 0.46 | 86.76 | 4.82 | — | 5.49 | 0.0063 | 0.0072 |
| 12 | PNC 2 (0.21) | 2.14 | — | 0.39 | 82.94 | 4.47 | — | 10.85 | 0.0055 | 0.0095 |
| 13 | PNC 2 (0.22) | 1.19 | — | 0.49 | 89.36 | 4.96 | — | 3.78 | 0.0120 | 0.0060 |
| 14 | PNC 2 (0.22) | 5.24 | — | 0.38 | 85.69 | 4.76 | — | 3.71 | 0.0033 | 0.0070 |
| 15 | PNC 2 (0.23) | 2.33 | — | 1.27 | 87.56 | 4.86 | — | 3.75 | 0.0149 | 0.0030 |
| 16 | PNC 2 (0.22) | 2.15 | — | 5.09 | 84.30 | 4.68 | — | 3.56 | 0.0190 | 0.0030 |
| 17 | PNC 2 (0.05) | 2.35 | — | 0.63 | 88.33 | 4.91 | — | 3.73 | 0.0160 | 0.0010 |
| 18 | PNC 2 (4.80) | 2.16 | — | 0.35 | 84.36 | 4.67 | — | 3.66 | 0.0015 | 0.0025 |
| 19 | PNC 2 (0.21) | — | 5.76 | 0.66 | 85.05 | 4.73 | — | 3.59 | 0.0130 | 0.0065 |
| 20 | PNC 2 (0.29) | 2.26 | — | 0.48 | — | — | 93.24 | 3.73 | 0.0055 | 0.0105 |

EXAMPLES 21-23

Photosensitive layers containing PNC 2 as a photochromic compound were manufactured using the same method as described in Example 1. The photosensitive layers commonly contained UV photoinitiator DMBP as a coinitiator. This photoinitiator induces photocuring of the layer due to an incoherent UV light effect. The incoherent UV light was used to obtain a photoinduced form of the photochromic compound. DMBP was added into a solution of VP at a first stage of preparing each of the samples. In addition, PMMA was added as a polymer binding agent into each of the compositions. In particular, PMMA was dissolved in chloroform and added into the VP solution containing the photochromic compound, the polymerizable compound, etc. Additionally, the chloroform was removed from each of the photopolymerizing compositions in a vacuum. The compositions of samples 21-23 are shown in Table 8. DBP was further added as a plasticizer into the PMMA solution to obtain sample 23.

Photoinduced refractive index changes measured using the same method as described in Example 1 are also shown in Table 8. The data indicates that photocuring can be induced in the photosensitive layer by the UV light used to generate the visible light-sensitive photoinduced form of the photosensitizer, and a phase hologram can be recorded using laser light in a visible wavelength range.

TABLE 8

| Sample No. | Photochromic compound (wt %) | Coinitiator (wt %) | | Polymerizable compound (wt %) | | Binding agent (wt %) | Plasticizer (wt %) | Photoinduced refractive index change $\Delta n$ | |
|---|---|---|---|---|---|---|---|---|---|
| | | DMEA | DMBP | OKM-2 | VP | PMMA | DBP | $\Delta n = n^{UV} - n^{init}$ | $\Delta n = n^{vis} - n^{UV}$ |
| 21 | PNC 2 (0.22) | 2.25 | 0.55 | 46.61 | 3.74 | 46.62 | — | 0.0045 | 0.0093 |
| 22 | PNC 2 (0.23) | 2.16 | 0.51 | — | 3.83 | 97.23 | — | 0.0025 | 0.0050 |
| 23 | PNC 2 (0.25) | 2.20 | 0.50 | — | 3.73 | 92.13 | 5.0 | 0.0020 | 0.0045 |

EXAMPLES 24-25

Photosensitive layers containing BSTP 1 as a photochromic compound were manufactured using photopolymerizing compositions (refer to Table 9) according to the same method as described in Example 1. VP or BB was used as a solvent. The compositions of samples 24 and 25 are shown in Table 9.

Photoinduced refractive index changes measured using the same method as described in Example 1 are also shown in Table 9. The data indicates the possibility of recording a phase hologram using the samples.

TABLE 9

| Sample No. | Photochromic compound (wt %) | Coinitiator (wt %) DMEA | Polymerizable compound (wt %) | | | Non-polymerizing solvent (wt %) BB | Photoinduced refractive index change ($\Delta n = n^{vis} - n^{UV}$) |
|---|---|---|---|---|---|---|---|
| | | | OKM-2 | TMPTA | VP | | |
| 24 | BTSP 1 (0.27) | 2.33 | 89.58 | 4.97 | 2.99 | — | 0.0020 |
| 25 | BTSP 1 (0.26) | 2.19 | 89.59 | 4.98 | — | 2.98 | 0.0005 |

EXAMPLES 26-44

Photosensitive layers containing BTSP as a photochromic compound were manufactured using the same method as described in Example 1. The photosensitive layers commonly contained UV photoinitiator DMBP as a coinitiator. This photoinitiator induces photocuring of the layer due to an incoherent UV light effect. The incoherent UV light was used to obtain a photoinduced form of the photochromic compound. DMBP was added into a solution of VP at a first stage of preparing each of the samples. The compositions of samples 26-44 are shown in Table 10.

Photoinduced refractive index changes measured using the same method as described in Example 1 are also shown in Table 10. The data indicates that photocuring can be induced in the photosensitive layer by the UV light used to generate the visible light-sensitive photoinduced form of the photosensitizer, and a phase hologram can be recorded using laser light in a visible wavelength range.

TABLE 10

| No.* | Photochromic compound (wt %) | Coinitiator (wt %) | | | Polymerizable compound (wt %) | | | | | Photoinduced refractive index change ($\Delta n$) | |
|---|---|---|---|---|---|---|---|---|---|---|---|
| | | DMEA | TEA | DMBP | OKM-2 | TMPTA | bis GMA | TGM | VP | $\Delta n = n^{UV} - n^{init}$ | $\Delta n = n^{vis} - n^{UV}$ |
| 26 | BTSP 1 (0.28) | 2.18 | — | 0.54 | 89.10 | 4.95 | — | — | 2.94 | 0.0042 | 0.0177 |
| 27 | BTSP 1 (0.25) | 2.31 | — | 0.49 | — | 23.98 | 69.85 | — | 3.82 | 0.0010 | 0.0160 |
| 28 | BTSP 1 (0.28) | 2.34 | — | 0.84 | — | — | 46.39 | 46.39 | 3.76 | 0.0040 | 0.0145 |
| 29 | BTSP 2 (0.44) | 2.15 | — | 0.65 | 88.05 | 4.89 | — | — | 3.82 | 0.0025 | 0.0060 |
| 30 | BTSP 3 (0.25) | 2.25 | — | 0.59 | 46.59 | 46.59 | — | — | 3.73 | 0.0028 | 0.0048 |
| 31 | BTSP 3 (0.24) | 2.16 | — | 0.53 | — | 93.25 | — | — | 3.82 | 0.0005 | 0.0005 |
| 32 | BTSP 3 (0.27) | 2.36 | — | 0.58 | 93.16 | — | — | — | 3.73 | 0.0020 | 0.0065 |
| 33 | BTSP 3 (0.22) | 2.13 | — | 0.68 | 82.20 | 4.84 | — | — | 5.03 | 0.0015 | 0.0045 |
| 34 | BTSP 3 (0.24) | 1.99 | — | 0.56 | 81.56 | 4.53 | — | — | 11.12 | 0.0030 | 0.0075 |
| 35 | BTSP 3 (0.23) | 1.09 | — | 0.47 | 89.46 | 4.97 | — | — | 3.78 | 0.0005 | 0.0070 |
| 36 | BTSP 3 (0.24) | 4.76 | — | 0.57 | 85.75 | 4.76 | — | — | 3.53 | 0.0010 | 0.0030 |
| 37 | BTSP 3 (0.25) | 2.17 | — | 0.13 | 88.87 | 4.93 | — | — | 3.75 | 0.0003 | 0.0040 |
| 38 | BTSP 3 (0.26) | 2.17 | — | 4.85 | 84.55 | 4.69 | — | — | 3.48 | 0.0078 | 0.0100 |
| 39 | BTSP 3 (0.04) | 2.36 | — | 0.46 | 88.40 | 4.91 | — | — | 3.83 | 0.0025 | 0.0020 |
| 40 | BTSP 3 (2.51) | 2.21 | — | 0.58 | 86.76 | 4.79 | — | — | 3.55 | 0.0015 | 0.0025 |
| 41 | BTSP 3 (0.22) | — | 5.71 | 0.53 | 85.29 | 4.74 | — | — | 3.51 | 0.0080 | 0.0010 |
| 42 | BTSP 3 (0.24) | 2.35 | — | 0.51 | — | — | 93.17 | — | 3.73 | 0.0225 | 0.0080 |
| 43 | BTSP 3 (0.28) | 2.21 | — | 0.77 | 88.08 | 4.89 | — | — | 3.77 | 0.0005 | 0.0055 |
| 44 | BTSP 4 (0.28) | 2.25 | — | 0.53 | 88.30 | 4.91 | — | — | 3.73 | 0.0005 | 0.0170 |

*Sample No.

EXAMPLES 45-47

Photosensitive layers containing BTSP 3 as a photochromic compound were manufactured using the same method as described in Example 1. The photosensitive layers commonly contained UV photoinitiator DMBP as a coinitiator.

This photoinitiator induces photocuring of the layer due to an incoherent UV light effect. The incoherent UV light was used to obtain a photoinduced form of the photochromic compound. DMBP was added into a solution of VP at a first stage of preparing each of the samples. In addition, PMMA was added as a polymer binding agent into each of the compositions. In particular, PMMA was dissolved in chloroform and added to the VP solution containing photochromic compound BTSP 3, DMBP coinitiator, etc. Additionally, the chloroform was removed from each of the photopolymerizing compositions in a vacuum. The compositions of samples 45-47 are shown in Table 11.

Photoinduced refractive index changes measured using the same method as described in Example 1 are also shown in Table 8. The data indicates that photocuring can be induced in the photosensitive layer by the UV light used to generate the visible light-sensitive photoinduced form of the photosensitizer, and a phase hologram can be recorded using laser light in a visible wavelength range.

light effect. The incoherent UV light was used to obtain a photoinduced form of the photochromic compound. DMBP was added into a solution of VP at a first stage of preparing each of the samples. The compositions of samples 48-54 are shown in Table 12.

Photoinduced refractive index changes measured using the same method as described in Example 6 are also shown in Table 12. The data indicates that photocuring can be induced to the photosensitive layer by UV light used to generate the visible light-sensitive photoinduced form of the photosensitizer, and a phase hologram can be recorded using laser light in a visible wavelength range.

TABLE 11

| Sample No. | Photochromic compound (wt %) | Coinitiator (wt %) | | Polymerizable compound (wt %) | | Plasticizer (wt %) | Binding agent (wt %) | Photoinduced refractive index change ($\Delta n$) | |
|---|---|---|---|---|---|---|---|---|---|
| | | DMEA | DMBP | OKM-2 | VP | DBP | PMMA | $\Delta n = n^{UV} - n^{init}$ | $\Delta n = n^{vis} - n^{UV}$ |
| 45 | BTSP 3 (0.23) | 2.25 | 0.66 | 46.57 | 3.72 | — | 46.57 | 0.0010 | 0.0105 |
| 46 | BTSP 3 (0.29) | 2.10 | 0.42 | — | 3.84 | — | 93.39 | 0.0060 | 0.0160 |
| 47 | BTSP 3 (0.25) | 2.25 | 0.59 | — | 3.73 | 4.12 | 89.27 | 0.0030 | 0.0135 |

TABLE 12

| Sample No. | Photochromic compound (wt %) | Co-initiating gent (wt %) | | | Polymerizable compound (wt %) | | | | | Photoinduced refractive index change ($\Delta n$) | |
|---|---|---|---|---|---|---|---|---|---|---|---|
| | | DMEA | TEA | DMBP | OKM-2 | TMPTA | bis GMA | TGM | VP | $\Delta n = n^{UV} - n^{init}$ | $\Delta n = n^{vis} - n^{UV}$ |
| 48 | DHE 1 (0.22) | — | 2.18 | — | 88.66 | 4.98 | — | — | 2.96 | 0.0000 | 0.0100 |
| 49 | DHE 1 (0.26) | 2.33 | — | 0.70 | 89.02 | 4.98 | — | — | 2.93 | 0.0075 | 0.0160 |
| 50 | DHE 1 (0.48) | 2.25 | — | 0.52 | 69.70 | 23.23 | — | — | 3.82 | 0.0138 | 0.0035 |
| 51 | DHE 1 (0.42) | 2.31 | — | 0.50 | — | — | 46.5 | 46.5 | 3.73 | 0.0005 | 0.0115 |
| 52 | DHE 2 (0.24) | 2.25 | — | 0.44 | 88.33 | 4.91 | — | — | 3.83 | 0.0160 | 0.0045 |
| 53 | DHE 3 (0.39) | 2.16 | — | 0.49 | 88.26 | 4.91 | — | — | 3.79 | 0.0019 | 0.0040 |
| 54 | FGM 1 (0.26) | 2.06 | — | 0.69 | 88.22 | 4.91 | — | — | 3.79 | 0.0200 | 0.0020 |

EXAMPLES 48-54

Photosensitive layers containing DHE or FGM as a photochromic compound were manufactured using the same method as described in Example 1. The photosensitive layers, except for sample 48, commonly contained UV photoinitiator DMBP as a coinitiator. This photoinitiator induces photocuring of the layer due to an incoherent UV

EXAMPLE 55

A hologram was recorded on a photopolymerizing recording medium manufactured using the method described in Example 22. An angular sensitivity of the medium that determines information storage capacity was varied as follows.

The photosensitive layer was placed between two sheets of PET films (Lavsan film) spaced by a 0.5 mm-thick spacer.

A middle portion of the recording medium was cut and filled with the photopolymerizing composition. Prior to recording a hologram, the recording medium was irradiated for 1 minutes by incoherent UV light emitted from a lamp (DRS-250) through a color filter UFS-6 ($\lambda$=360 nm) to transform the chromatic compound in the sample into a colored form.

Holographic gratings were recorded on the resulting recording medium using coherent laser light emitted from an Ar laser ($\lambda$=488 nm) at 5.5 mW/cm$^2$.

After the recording of holographic gratings, the recording medium was fully bleached using visible light emitted from an Ol-18 lighter. Coherent light having a wavelength of 633 nm emitted from a He—Ne laser was radiated to reproduce the holographic gratings. Radiation diffractions were measured in real time using a photodetector positioned at a Bragg angle. The dependency of diffraction efficiency on the angle was measured while varying the angle of inclination of recording and reproducing laser beams.

Figure 1:
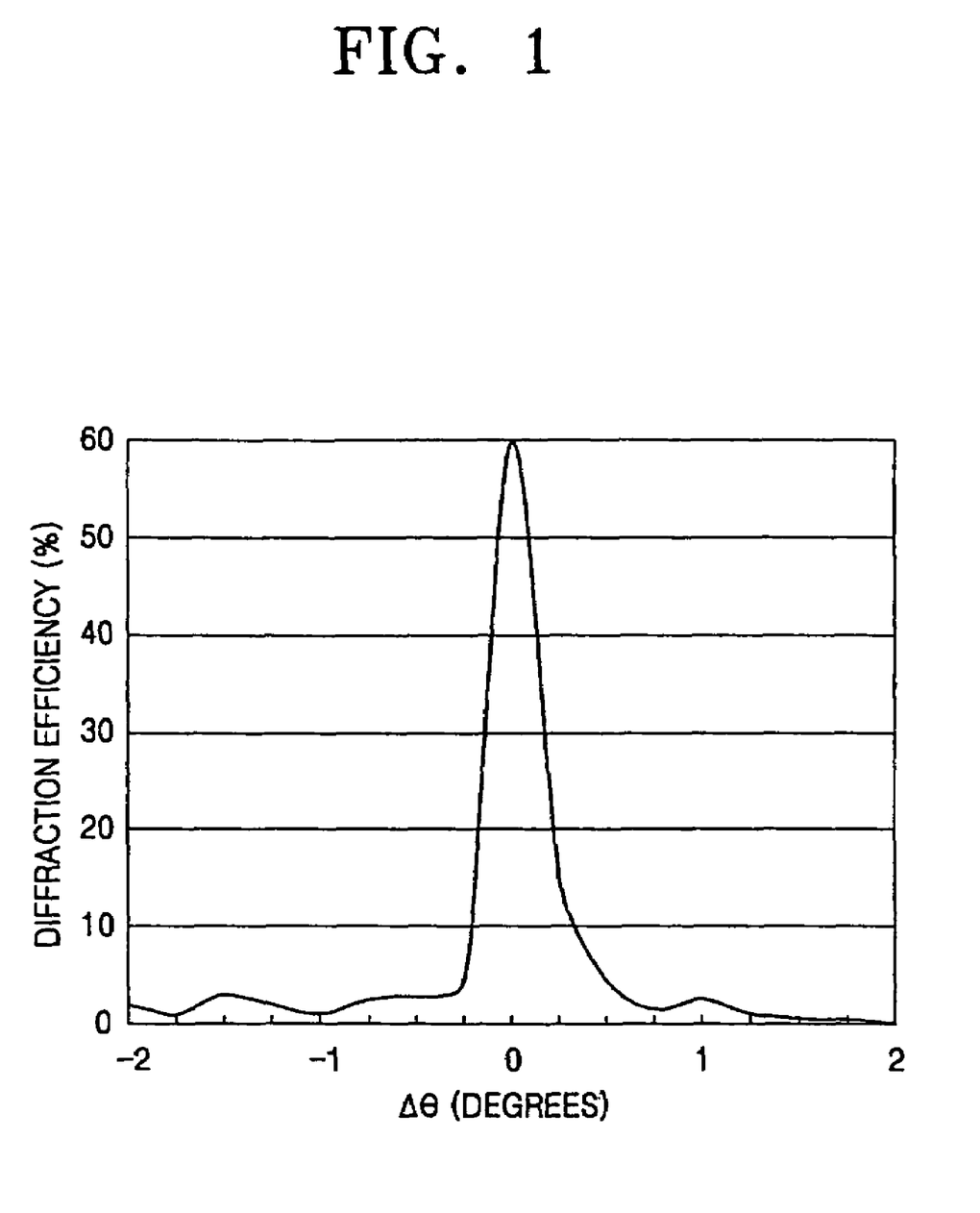
FIG. 1 is a graph of diffraction efficiency versus angle when an Ar laser is radiated at 5.5 mW/cm$^2$ on diffraction gratings in a photopolymerizing recording medium according to an embodiment of the present invention.

FIG. 1 is a graph of diffraction efficiency versus angle when an Ar laser was radiated onto the gratings of the recording medium at 5.5 mW/cm$^2$. Referring to FIG. 1, the diffraction efficiency in the recording medium greatly depends on angles (i.e., high angular selectivity), indicating that the photopolymerizing recording medium can be used in the manufacturing of a 3D optical memory with ultra-high information storage capability.

EXAMPLE 56

A photopolymerizing recording medium was manufactured using the same method as used in Example 55, except that a glass plate instead of the PET film was used to form the triplex structure. Holographic gratings were recorded on the recording medium using the method described in Example 55. Satisfactory results were obtained using the recording medium.

As described above, using a photo'polymerizing composition according to an aspect of the present invention that contains a new combination of photoinitiator sytem, a photopolymerizing recording medium having a high angular selectivity of diffraction efficiency can be manufactured. In addition, the photopolymerizing recording medium can be effectively used to manufacture a 3D holographic optical memory having ultra high information storage capacity. According to an aspect of the present invention, no post-exposure and heating processes are required after recording holograms.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A photopolymerizing composition comprising:
   1.0-99.0% by weight of at least one kind of polymerizable compound;
   0.05-0.5% by weight of at least one kind of photosensitizer selected from among photochromic compounds that change color by incoherent UV light irradiation;
   0.2-6.0% by weight of a coinitiator that is activated by visible light in the presence of a photoinduced form of the photochromic compound transformed by the incoherent UV light to photopolymerize the polymerizable compound;
   0-97.5% by weight of a polymer binding agent;
   0-6.0% by weight of a plasticizer; and
   0-3.0% by weight of a non-polymerizing solvent,
   wherein the photochromic compounds are selected from a group consisting of dihetarylethenes, fylgimides, and a mixture thereof.

2. The photopolymerizing composition of claim 1, wherein the photochromic compounds are selected from a group consisting of benzothiazolene spiropyrans, phenoxynaphthacenequinones, and a mixture thereof.

3. The photopolymerizing composition of claim 1, wherein the polymerizable compound is selected from a group consisting of $\alpha,\omega$-bis (methacryloyloxyethyleneoxycarbonyloxy) ethyleneoxyethylene (OKM-2), trimethylolpropane triacrylate (TMPTA), bisphenol-A bis(glycidyldimethacrylate) (bisGMA), N-vinyl pyrrolidone (VP), glycerol trimethacrylate (TMG), and a mixture thereof.

4. The photopolymerizing composition of claim 1, wherein the polymer binding agent is polymethacrylate (PMMA).

5. The photopolymerizing composition of claim 1, wherein the coinitiator is selected from a group consisting of dimethylethanolamine (DMEA), triethanolamine (TEA), 2,2- dimethoxy-2-phenylacetophenone dimethylbenzylketal (DMBP), and a mixture thereof.

6. The photopolymerizing composition of claim 1, wherein the non-polymerizing solvent is selected from a group consisting of halogenated benzene, halogenated toluene, and a mixture thereof.

7. The photopolymerizing composition of claim 1, wherein the plasticizer is a phthalate compound.

8. A photopolymerizing recording medium comprising;
   a transparent substrate; and
   a photosensitive layer deposited on the transparent substrate as a recording layer,
   wherein the photosensitive layer comprises:
   1.0-99.0% by weight of at least one kind of polymerizable compound;
   0.05-0.5% by weight of at least one kind of photosensitizer selected from among photochromic compounds that change color by incoherent UV light irradiation;
   0.2-6.0% by weight of a coinitiator that is activated by visible light in the presence of a photoinduced form of the photochromic compounds transformed by the incoherent UV light to photopolymerize the polymerizable compound;
   0-97.5% by weight of a polymer binding agent;
   0-6.0% by weight of a plasticizer; and
   0-3.0% by weight of a non-polymerizing solvents,
   wherein the photochromic compounds are selected from a group consisting of dihetarylethenes, fylgimides, and a mixture thereof.

9. The photopolymerizing recording medium of claim 8, wherein the photochromic compounds are selected from a group consisting of benzothiazolene spiropyrans, phenoxynaphthacenequinbnes, and a mixture thereof.

10. The photopolymerizing recording medium of claim 8, wherein the polymerizable compound is selected from a group consisting of $\alpha,\omega$-bis(methacryloyloxyethyleneoxycarbonyloxy)ethyleneoxyethylene (OKM-2), trimethylolpropane triacrylate (TMPTA), bisphenol-A bis(glycidyldimethaorylate) (bisGMA), N-vinylpyrrolidone (VP), glycerol trimethacrylate (TMG), and a mixture thereof.

11. The photopolymerizing recording medium of claim 8, wherein the polymer binding agent is polymethacrylate (PMMA).

12. The photopolymerizing recording medium of claim 8, wherein the coinitiator is selected from a group consisting of dimethylethanolamine (DMEA), triethanolamine (TEA), 2,2- dimethoxy-2-phenylacetophenone dimethylbenzylketal (DMBP), and a mixture thereof.

13. The photopolymerizing recording medium of claim 8, wherein the nonpolymerizing solvent is selected from a group consisting of halogenated benzene, halogenated toluene, and a mixture thereof.

14. The photopolymerizing recording medium of claim 8, wherein the plasticizer is a phthalate compound.

15. The photopolymerizing recording medium of claim 8, further comprising a protective layer on the photosensitive layer.

16. The photopolymerizing recording medium of claim 8, wherein the transparent substrate and the protective layer are transparent polymer films.

17. The photopolymerizing recording medium of claim 8 wherein the photopolymerizing recording medium is a holographic memory.

18. A method of recording a hologram on the photopolymerizing recording medium according to claim 8, the method comprising:
   irradiating the incoherent UV light onto the photosensitive layer of the recording medium to transform the photochromic compounds into a colored form; and
   irradiating an interference pattern of a reference beam and an object beam, which are split from coherent visible laser light onto the photosensitive layer to induce photopolymerization of the photochromic compounds using free radicals generated in presence of the colored photochromic compounds and the coinitiator, thereby recording the interference pattern in the photosensitive layer as a refractive index difference.

19. The method of claim 18, wherein the refractive index difference is generated from a difference in a degree of polymerization that varies depending on intensities of light radiated on the interference pattern.

20. A method of reproducing a hologram recorded on the photosensitizing recording medium according to claim 8, the method comprising irradiating a reference beam onto the recording medium.

21. The photopolymerizing composition of claim 1, wherein the visible light has a wavelength of 400-650 nm.

22. The photopolymerizing recording medium of claim 8, wherein the visible light has a wavelength of 400-650 nm.

23. The photopolymerizing recording medium of claim 8, wherein the photosensitizer, the coinitiator, the polymerizable compound, the polymer binding agent and an additive are heated to a temperature range which does not induce denaturation.

24. The method of claim 18, wherein no post-exposure and heating processes are required after recording the hologram.

* * * * *

UNITED STATES PATENT AND TRADEMARK OFFICE
CERTIFICATE OF CORRECTION

PATENT NO. : 7,244,548 B2
APPLICATION NO. : 10/993125
DATED : July 17, 2007
INVENTOR(S) : Valery Aleksandrovich Barachevsky et al.

It is certified that error appears in the above-identified patent and that said Letters Patent is hereby corrected as shown below:

Title Page, Item (75) Inventors,
change 3rd Inventor from "Dmitry Valerevich Nesterenko" to --Dmitry Valer'evich Nesterenko--
change 7th Inventor from "Nataliya Timofeovna Sokolyuk" to --Nataliya Timofeevna Sokolyuk--
change 8th Inventor from "Andrei Leanovich Mikaelyan" to --Andrei Leonovich Mikaelyan--

Column 26, line 61,
change "bis(glycidyldimethaorylate)" to --bis(glycidyldimethacrylate)--

Signed and Sealed this

Twentieth Day of November, 2007

JON W. DUDAS
*Director of the United States Patent and Trademark Office*